United States Patent
Ichikawa

(10) Patent No.: US 6,462,633 B1
(45) Date of Patent: Oct. 8, 2002

(54) SURFACE ACOUSTIC WAVE DEVICE INCLUDING PARALLEL CONNECTED MAIN AND SUB-FILTERS

(75) Inventor: Satoshi Ichikawa, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/758,372

(22) Filed: Jan. 12, 2001

Related U.S. Application Data

(63) Continuation of application No. PCT/JP00/02906, filed on May 2, 2000.

(30) Foreign Application Priority Data

May 14, 1999 (JP) .......................................... 11-134021

(51) Int. Cl.$^7$ ................................................ H03H 9/64
(52) U.S. Cl. ...................................... 333/193; 333/195
(58) Field of Search ................................. 333/193–196

(56) References Cited

U.S. PATENT DOCUMENTS

| | | | | |
|---|---|---|---|---|
| 5,379,010 A | * | 1/1995 | Ruile et al. ................. | 333/195 |
| 5,559,483 A | * | 9/1996 | Kajihara et al. ............ | 333/195 |
| 5,646,584 A | * | 7/1997 | Kondratyev et al. ........ | 333/193 |
| 5,661,444 A | * | 8/1997 | Dill et al. ................... | 333/195 |
| 5,666,092 A | * | 9/1997 | Yamamoto et al. ......... | 333/194 |
| 5,909,158 A | * | 6/1999 | Hiramoto .................... | 333/195 |
| 6,104,260 A | * | 8/2000 | Yamada et al. ............. | 333/193 |

FOREIGN PATENT DOCUMENTS

| | | |
|---|---|---|
| JP | 55-97722 | 7/1980 |
| JP | 7-297669 | 11/1995 |
| JP | 7-336190 | 12/1995 |
| JP | 9-214284 | 8/1997 |
| JP | 10-70436 | 3/1998 |
| JP | 10-284981 | 10/1998 |

OTHER PUBLICATIONS

1999 IEEE Ultrasonics Symposium—Proceedings—S.C. Schneider, M. Levy, B.R. McAvoy, Editors, An International Symposium Sponsored by the Ultrasonics, Ferroelectrics, and Frequency Control Society, Oct. 17–20, 1999 Caesars Tahoe, Nevada, USA, vol. 1, 99CH37027, ISSN:1051–0117.

Dansei Hyomenha Soshi Handbook (1$^{st}$ ed.; 1$^{st}$ printing) Kabushiki Kaisha Omusha, Nov. 30, 1991, pp. 192–194.

* cited by examiner

*Primary Examiner*—Robert Pascal
*Assistant Examiner*—Barbara Summons
(74) *Attorney, Agent, or Firm*—Oblon, Spivak, McClelland, Maier & Neustadt, P.C.

(57) ABSTRACT

A band filter is provided which can freely set the bandwidth and blocking characteristic without any need for a high level designing and adjustment. To this end, a surface acoustic wave device is so constructed as to connect a main filter Fm and sub-filter Fs in a parallel array. Here, relative to a frequency area corresponding to a passband of the main filter Fm the frequency-attenuation amount characteristic of the sub-filter Fs has a blocking band and, relative to a slope portion formed outside a passband of the main filter Fm, the frequency-attenuation characteristic of the sub-filter Fs has a rising area constituting a passband and signals involved provide an opposite-phase relation.

12 Claims, 10 Drawing Sheets

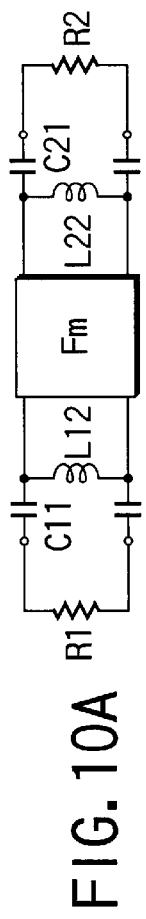
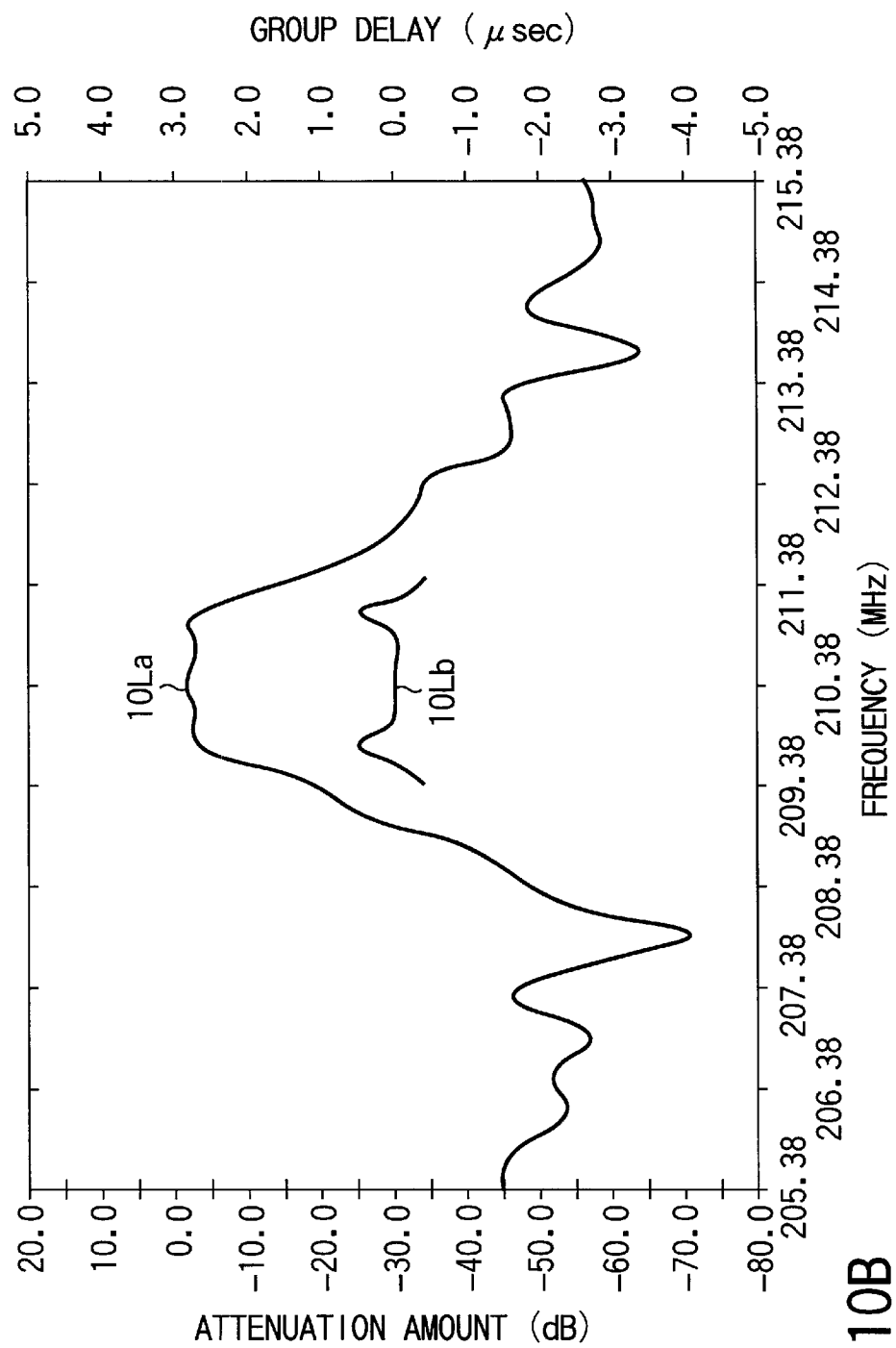
FIG. 10A
FIG. 10B

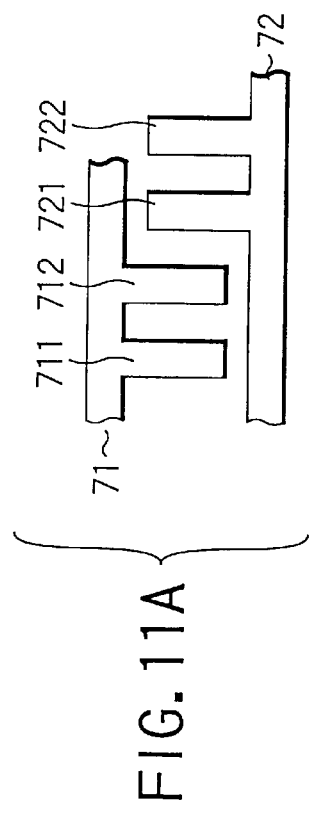
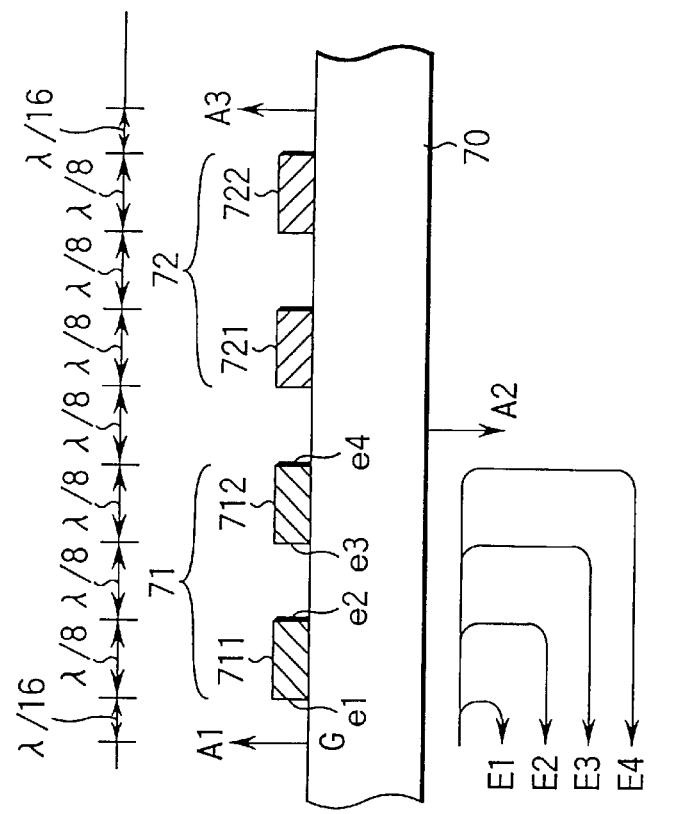
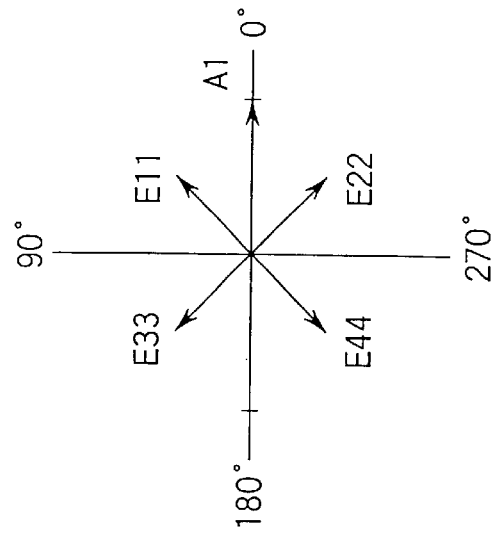

SURFACE ACOUSTIC WAVE DEVICE INCLUDING PARALLEL CONNECTED MAIN AND SUB-FILTERS

CROSS-REFERENCE TO RELATED APPLICATIONS

This is a continuation of application Ser. No. PCT/JP00/02906, filed May 2, 2000, which was not published in English.

This application is based upon and claims the benefit of priority from the prior Japanese Patent Application No. 11-134021, filed May 14, 1999, the entire contents of which are incorporated herein by reference.

BACKGROUND OF THE INVENTION

The present invention relates to a surface acoustic wave device constructed by input and output transducers formed on a piezoelectric substrate and, in particular, to a surface acoustic filter effectively used in the mobile communications field.

In a surface acoustic wave device used in the field of a mobile communications apparatus, not only a low loss but also an abrupt out-of-band blocking characteristic is required. In a GSM-IF filter standardized in the European countries, for example, a low loss characteristic are broader band are required, and in addition out-of-band blocking characteristic is also required since a number of channels are located close to the broader band.

In order to obtain such characteristic, use has been made of ① a resonator type filter having a plurality of cascade-connected surface acoustic resonator filters, ② a resonator type filter having a plurality of surface acoustic resonator filters connected in a parallel array in an opposite phase relation, and ③ an R(resonant)-SPUDT(Single Phase Uni-directional Transducer) type filter in which respective transducers are constructed of SPUDTs and associated transducers are comprised of a normal SPUDT section having a surface wave propagation direction and a counter SPUDT section having a counter surface wave propagation direction, and so on.

In the resonator type filter of ① however, many more connection stages are needed to obtain an abrupt blocking characteristic, thus involving a disadvantage of an insertion loss. Further, in order to obtain a broader band characteristic it is necessary to take a phase matching of the individual resonators, so that it is difficult to mount them.

In the filter of ②, the passband width are broadened through the multiplexing of the frequency characteristic of the respective resonator filters and, in any frequency area, the phase characteristics of the respective resonator filters are so designed as to be made opposite in polarity. If, therefore, the frequency interval of a multiplexing mode of one resonant filter is even slightly displaced from a designed value, a distortion appears in the passband, thus making it difficult to mass produce filters of uniform characteristic. In order to suppress any unwanted high-order area outside the passband, there was the drawback of requiring a high degree of adjustment on the phase characteristic of the two resonators.

In the R-SPUDT type filter, both the passband width and skirt characteristic (falling characteristic of a slop portion adjacent to the passband) depend upon the surface wave reflectivity of the transducer and it is difficult to adjust these characteristics (passband width and skirt characteristic) independently. It was, therefore, difficult to design a filter of a broader band and abrupt blocking characteristic.

It is accordingly the object of the present invention to provide a surface acoustic wave device capable of freely setting the frequency passband width and blocking characteristic without requiring any high degree of designing and adjustment.

BRIEF SUMMARY OF THE INVENTION

A surface acoustic wave device of the present invention is comprised of two parallel-connected surface acoustic filters of a main filter Fm and sub-filter FS. The device is characterized in that, relative to the frequency band constituting a passband of the main filter Fm, the sub-filter Fs has a frequency blocking band (attenuation band) and that, relative to a slope portion outside the passband of the main filter, the sub-filter Fs has a rising area of a frequency-attenuation amount characteristic.

An overall characteristic of the passband of the surface acoustic wave device as a whole is determined by a resultant characteristic of individual characteristic of the main filter Fm and sub-filter Fs. And, in the surface acoustic wave device, the passband width of the device as a whole is determined mainly by the passband width of the main filter Fm. That is, in the passband of the main filter Fm, the characteristic of the sub-filter Fs defined a blocking band and, in this blocking area, the sub-filter Fs is electrically open or in a high impedance state as seen from the main filter Fm. As a result, in the frequency band, the characteristic of the main filter Fm is directly reflected on the overall characteristic of the element as a whole.

In a frequency area outside the passband of the main filter Fm, the sub-filter Fs has a rising area and, in this area, the sub-filter Fs allows an input signal to pass through only at a predetermined level. Through the utilization of the signal passed through the sub-filter Fs it is possible to obtain any resultant characteristic with a signal passed through the main filter Fm.

Stated in more detail, in a predetermined frequency area (slope portion) outside the passband of the main filter Fm, a signal passing through the sub-filter Fs is so set as to have a different phase from a signal passing through the main filter Fm and, more preferably, these signals are so set as to have mutually opposite polarity phase characteristics. By doing so, the signals passing through the main filter Fm and sub-filter Fs are cancelled with respect to each other in a predetermined frequency area and, from an outer appearance of the element as a whole, the passing signal at an unwanted band is blocked. Therefore, the output signal level (unwanted signal level) of the device as a whole in a frequency area outside the passband of the main filter Fm can be made more suppressed than the output signal level of each of the main filter Fm and sub-filter Fs. More preferably, if, in this frequency area, the phases of the signals of the main filter Fm and sub-filter Fs are made to 180° differ and the amplitude levels of their passing characteristics are made the same, a resultant output signal of the filter is completely blocked in this area. By setting a mutually cancelled signal area to a slope portion of the frequency-attenuation amount characteristic it is possible to obtain an abrupt blocking characteristic from an overall viewpoint.

Thus, the passband characteristic of the device as a whole can be determined by the passband characteristic alone of the main filter Fm while, on the other hand, the out-of-passband characteristic of the device as a whole has only to properly adjust the phase of the signal of the sub-filter Fs relative to the phase of the signal of the main filter Fm. It is, therefore, possible to freely set the bandwidth and blocking characteristic of the device as a whole by a simple method.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10A is a view which, in order to explain the effect of the present invention, shows a state in which an external matching circuit is connected to the main filter Fm alone as in the case of FIG. 9A;

FIG. 10B is a view showing a filtering characteristic, together with group delay characteristics, in a state including the main filter Fm and matching circuit in FIG. 10A;

FIG. 11A is a view which, in order to explain a basic way of thinking, shows a portion of a transducer for the case of analyzing internally reflected waves of a uni-directional transducer applied to the present invention;

FIG. 11B is a view showing a cross-section of electrode fingers in FIG. 11A; and FIG. 11C shows the phase of respective vectors in FIG. 11B.

DETAILED DESCRIPTION OF THE INVENTION

An explanation will be made below about an embodiment of the present invention.

Figure 1:
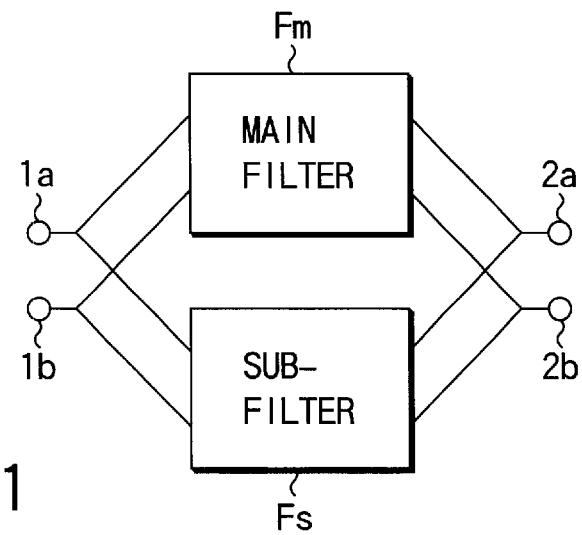
FIG. 1 is a view showing a basic structure of a surface acoustic wave device according to one embodiment of the present invention.
Figure 2:
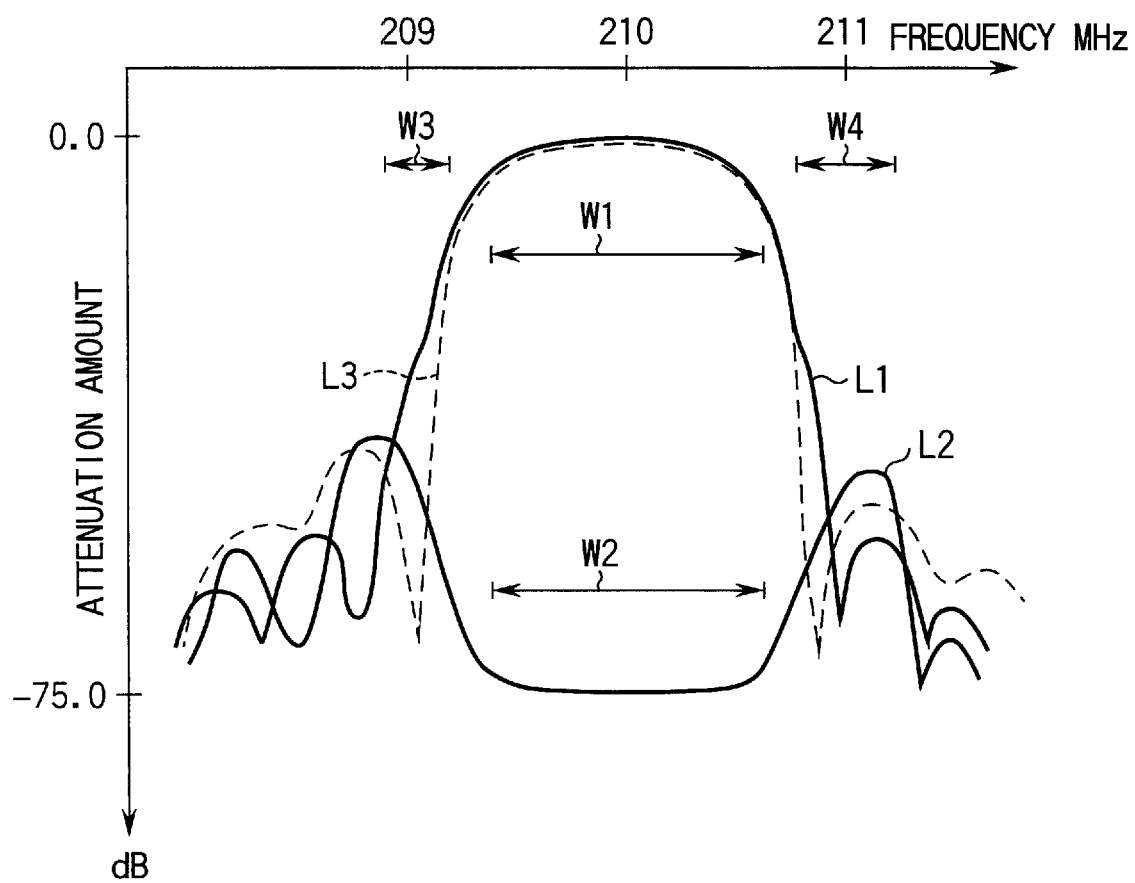
FIG. 2 is a view showing the frequency-attenuation characteristic of the surface acoustic wave device in FIG. 1.

FIG. 1 shows a basic structure of a surface acoustic wave device. A main filter Fm and sub-filter Fs of a surface acoustic filter have their inputs and outputs commonly connected in a parallel array. One input terminal 1a thereof is supplied with a signal from an outside and the other input terminal 1b thereof is connected to ground. Further, to one output terminal 2a thereof a signal passed through the filter is delivered and the other output terminal 2b is connected to ground. FIG. 2 shows a frequency-attenuation amount characteristic of the surface acoustic wave device of the present embodiment. In FIG. 2, the solid lines L1 and L2 show the characteristics of the main filter Fm and sub-filter Fs, respectively, as a single element each, and the dotted line L3 shows a total characteristic as the surface acoustic wave device which comprises a resultant characteristic of the main filter Fm and sub-filter Fs.

The sub-filter Fs has a frequency blocking band W2 substantially matched to a frequency passband W1 of the main filter Fs. Further, the sub-filter Fs has passbands W3 and W4 with this frequency blocking band in between. The passbands W3 and W4 of the sub-filter Fs are situated outside the frequency passband W1 of the main filter Fs as shown. Such a characteristic is obtained by adjusting an electrode finger array pattern, electrode finger pitch, etc., of a transducer constituting the main filter Fm and sub-filter Fs.

In a slope portion of the characteristic of the main filter Fm adjacent to the passbands W3 and W4 of the sub-filter Fs, the sub-filter Fs and main filter Fm are such that the phase characteristics of their passing signals have an opposite polarity to each other as set out below.

As a result, the resultant overall frequency passband characteristic of the filters is substantially matched to the passband characteristic of the main filter Fm. In the slope portion of the passband characteristic of the main filter Fm, on the other hand, the signals of the main filter Fm and sub-filter Fs are in an opposite phase and cancelled with respect to each other, so that the slope portion of the overall frequency bandpass characteristic reveals an abrupt fall.

Figure 3:
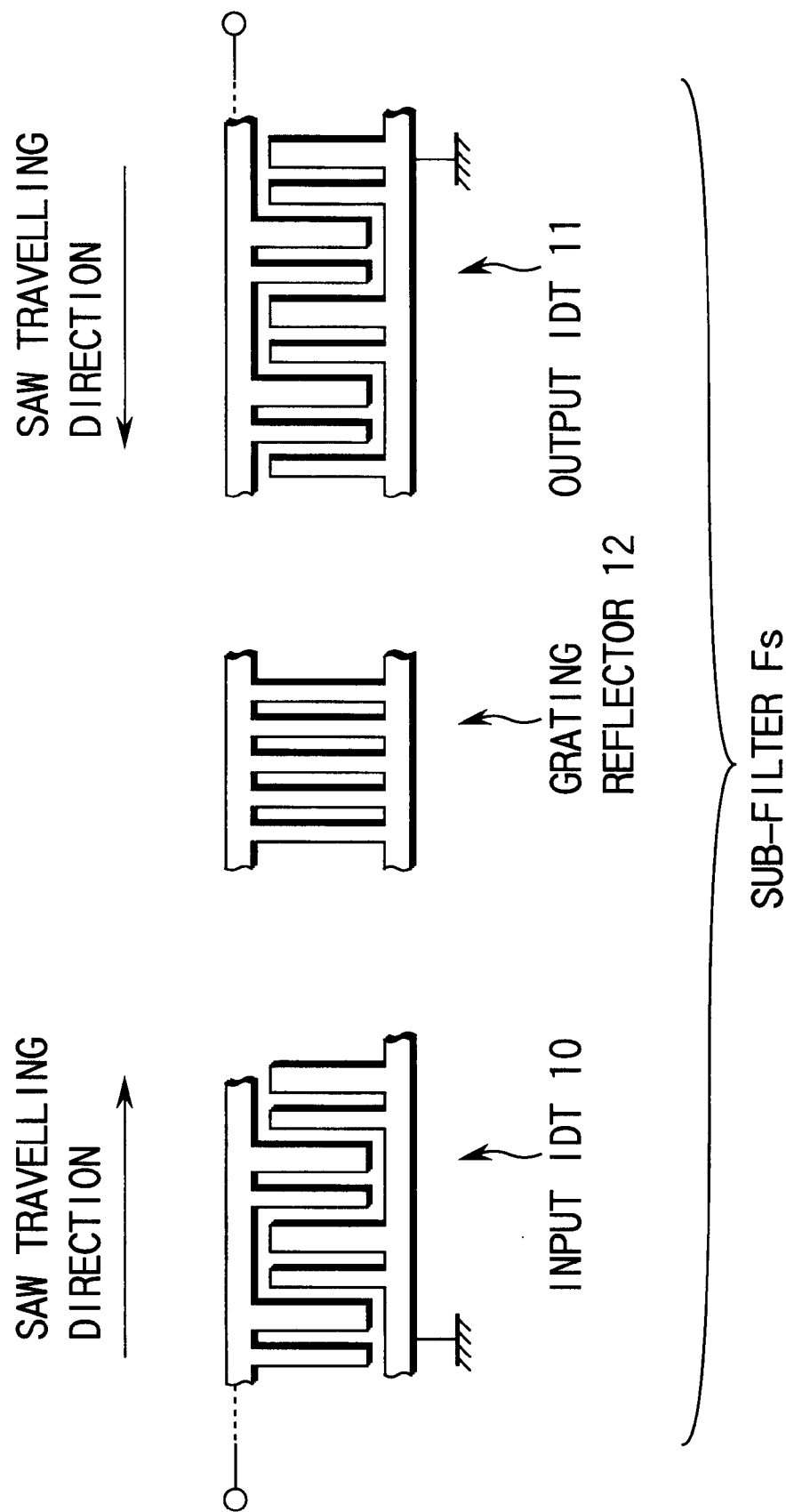
FIG. 3 is a view diagrammatically showing a structure of a sub-filter Fs constituting the surface acoustic wave device of FIG. 1.

FIG. 3 diagrammatically shows a structure of one practical form of the sub-filter Fs. That is, a grating reflector 12 is arranged between an input transducer 10 and an output transducer 11. These transducers 10 and 11 are so arranged on a lithium borate ($Li_2B_4O_7$) single crystal substrate, that is, a piezoelectric substrate, that the electrode fingers of a signal-side comb-like electrode and ground-side comb-like electrode made mainly of aluminum (Al) are interleaved with respect to each other to provide an interdigital transducer (hereinafter referred to as an IDT). The arrows show a direction in which a surface acoustic wave (SAW) travels.

Further, the grating reflector 12 is comprised of a periodic array of metal strips formed of the same metal layer as the IDT. The input transducer 10 and transducer 11 are of the SPUDT type, the traveling of the surface acoustic wave is in a single direction and it is designed that the surface acoustic wave (SAW) is propagated toward the direction of the grating reflector 12. That is, the respective surface acoustic waves are propagated in a manner to be in a symmetric relation between the input transducer and the transducer 11. The thickness of the Al films constituting metal strips of the input and output transducers and grating reflector is set to be 1 percent (h/λ) of a standardized film thickness.

Here, the surface acoustic wave reflected from the grating reflector 12 toward the transducer 10 is a surface acoustic wave corresponding to the blocking band shown in FIG. 2. Further, the surface acoustic wave reflected from the grating reflector 12 toward the transducer 11 is a surface acoustic wave corresponding to the passbands of the characteristic of the main filter Fm in FIG. 2 which are situated on both the sides of the frequency blocking band. By doing so, a design consideration is paid to achieving the frequency blocking band W2 shown in FIG. 2 and passbands W3 and W4 situated on both the side of the frequency blocking area W2.

Further, in the present embodiment, the number of pairs of electrode fingers in the input transducer 10 is 85 and the number of pairs of electrode fingers in the output transducer 11 is 110 and the grating reflector is comprised of 165 metal strips.

Figure 4:
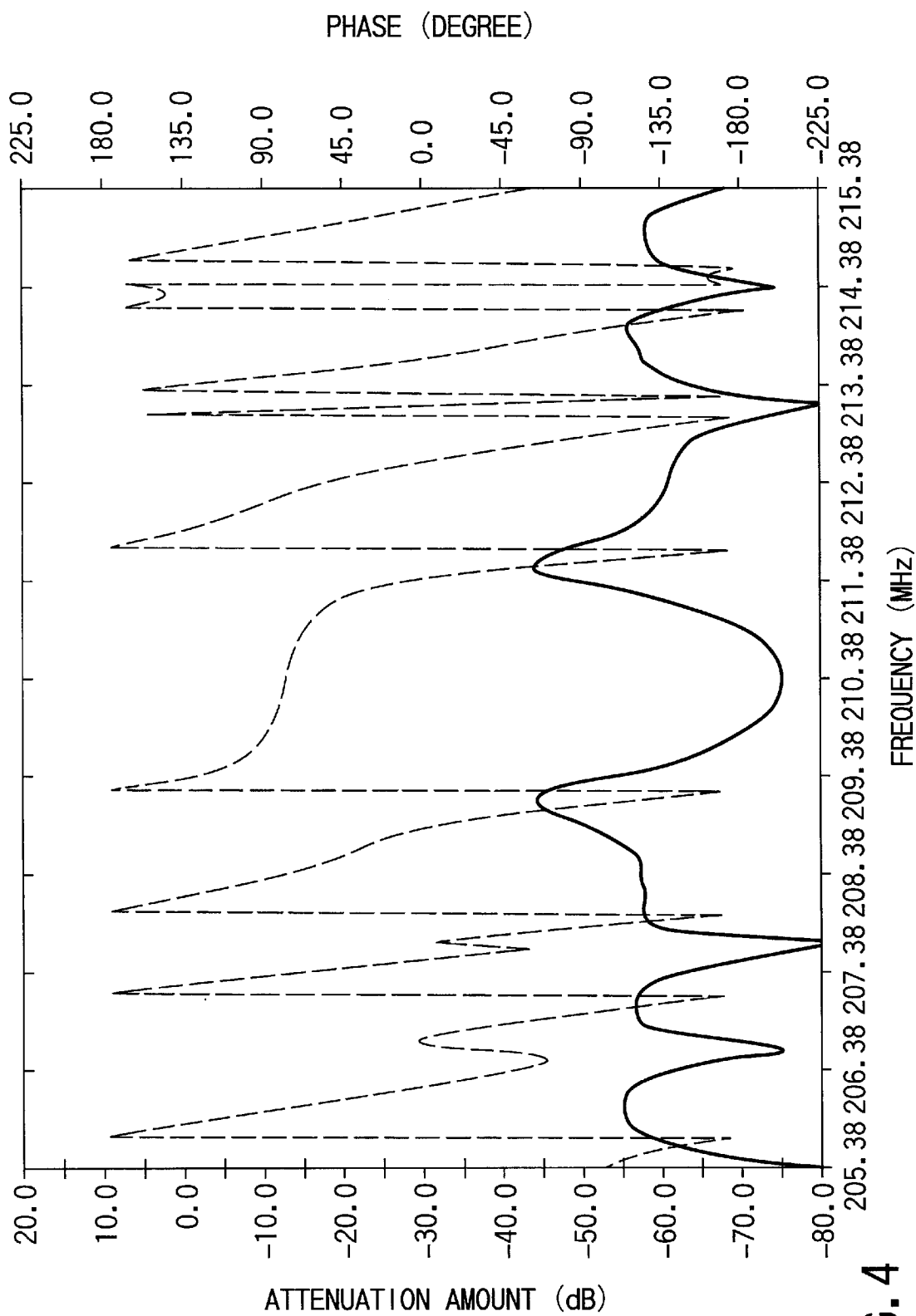
FIG. 4 is a view showing the characteristic of the surface acoustic filter of FIG. 3.

FIG. 4 shows a result of simulation performed on the frequency-attenuation amount characteristic and frequency-phase characteristic of the sub-filter Fs. It is to be noted that the abscissa in FIG. 4 shows the frequency (MHz), the left-side ordinate shows an attenuation amount (dB) and the right-side ordinate shows the phase (Degree). As shown by the solid line in FIG. 4, the sub-filter FS has a blocking band (the attenuation characteristic of above 70 dB) near 210 MHz and passbands on both sides of the blocking band, that is, near 209 MHZ and 211 MHZ. The passband corresponds to the slope portion of the characteristic of the main filter Fm. The sub-filter shown here is one example and may be comprised of a transversal type filter not having a grating reflector.

Figure 5:
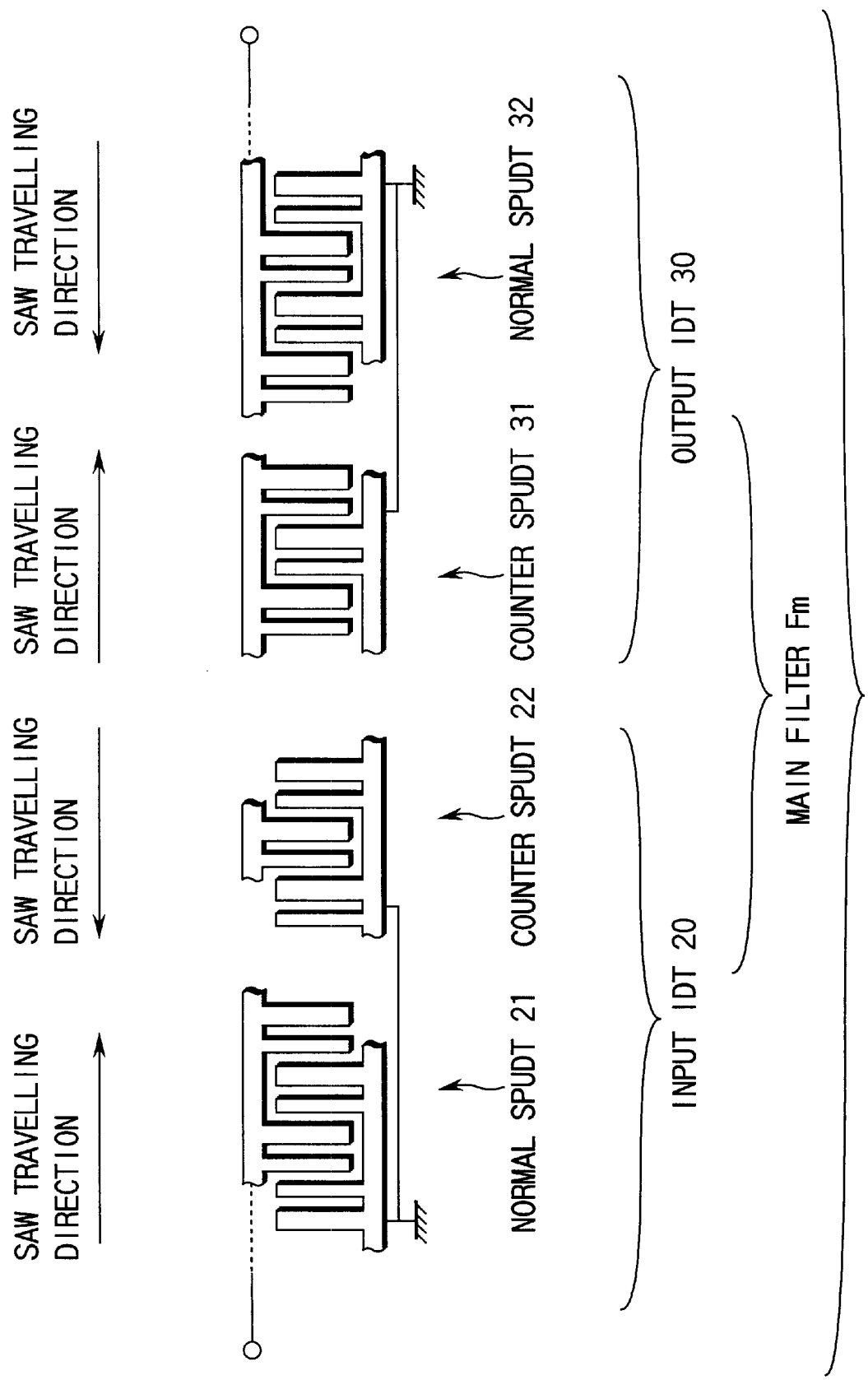
FIG. 5 is a view diagrammatically showing a structure of a main filter Fm constituting the surface acoustic wave device in FIG. 1.

FIG. 5 diagrammatically shows one practical form of the main filter Fm in FIG. 1. That is, an input transducer 20 and output transducer 30 are constructed as an R-SPUDT type filter based on the IDT in the same way as the sub-filter Fs. That is, the input transducer 20 is constructed of a normal SPUDT 21 section and counter SPUDT 22 section which are mutually opposite in their surface acoustic wave transmitting directions and the output transducer 30 is constructed of a normal SPUDT section 32 and counter SPUDT section 31. As viewed with the elastic surface wave propagation direction as an axis, the input transducer 20 and output transducer 30 are arranged mutually opposite in the axial direction. In this arrangement, the number of pairs of electrode fingers of the normal SPUDT sections 21 and 32 are 85 and the number of pairs of counter SPUDT sections 22 and 31 are 32. The structure shown here is one example of the main filter and may of course be constructed of a normal transversal type filter.

Figure 6:
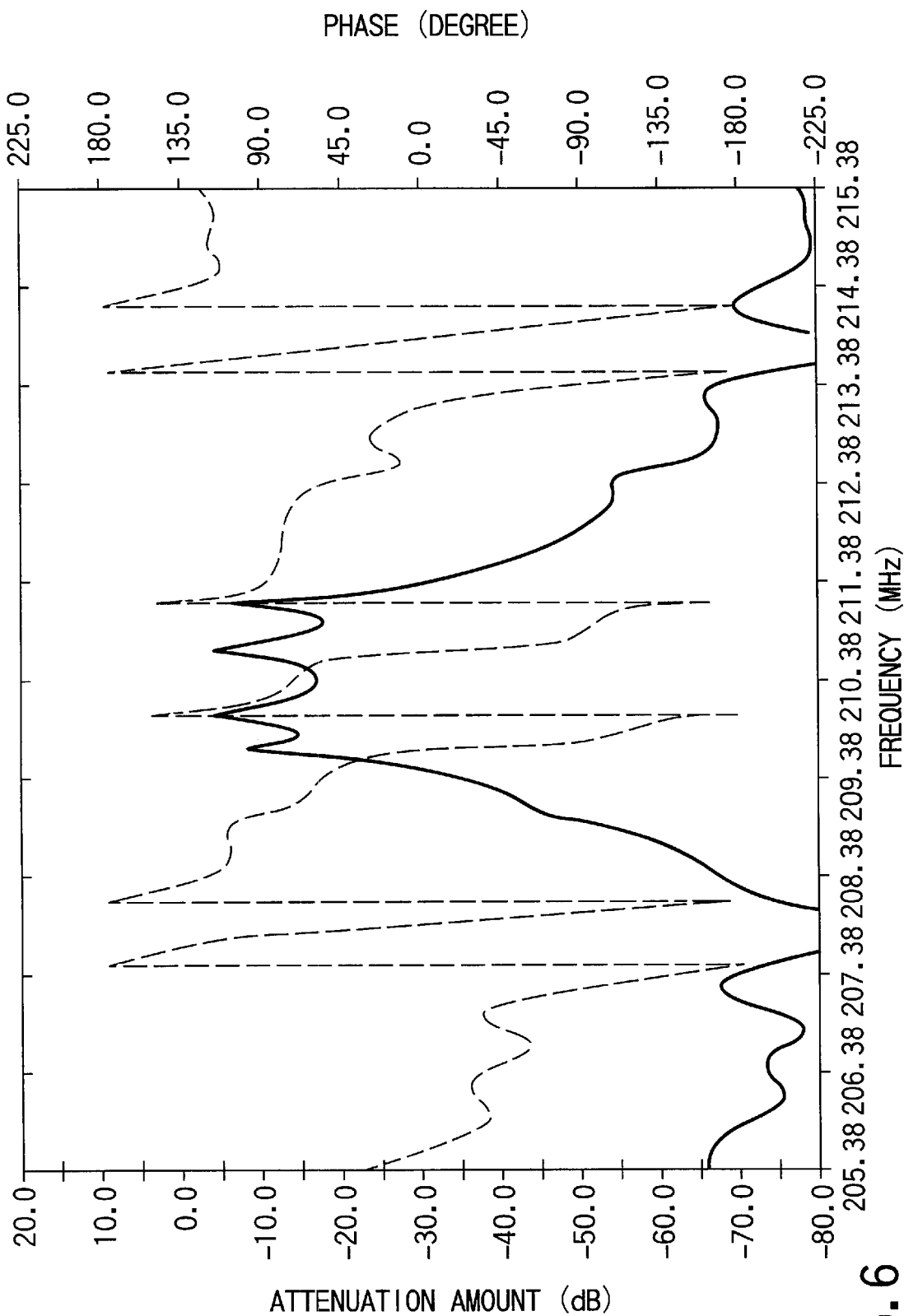
FIG. 6 is a view showing the characteristic of the surface acoustic filter in FIG. 5.

FIG. 6 shows a result of simulation performed on the frequency-attenuation amount characteristic and frequency-phase characteristic. It is to be noted that the abscissa in FIG. 6 shows a frequency (MHZ), a left-side ordinate shows an attenuation amount (dB) and right-side ordinate shows a phase (Degree).

As shown in FIG. 6, the main filter Fm has a passband near 210 MHZ and has a slope portion at both sides of this passband, that is, near 209 MHZ and 211 MHZ. In comparison between the frequency-phase characteristics of the filters shown in FIGS. 4 and 6 the polarities of the frequency-phase characteristics of these filters FM, Fs are opposite. In order to make the signal phases opposite in polarity in such given frequency area, for example, the following adjustment is basically made. That is, in the sub-filter Fs, the interval between the input transducer 10 and output transducer 11 is adjusted as a unit of λ or λ/2 (λ: the wavelength of the surface acoustic wave). In the main filter Fm, the interval between the input transducer 20 and the output transducer 30 is adjusted as a unit of λ/2 or λ. In the case where, as a result, the phase shift of signals between the main filter Fm and the sub-filter Fs is λ/2 with respect to a desired frequency (in this example, near 209 MHZ and 211 MHZ), the polarity relation of the mutual frequency characteristics can be made opposite to each other.

Further, in the desired frequency as set out above, there is also a method by which the frequency-phase characteristic is opposite in polarity as will appear later. That is, the interval between the input and output transducers in the sub-filter Fs and the interval in the main filter Fm are made the same. And the relation of a signal connection at one terminal/ground connection at the other terminal of the input transducer in the sub-filter Fs and relation of a signal connection at one terminal/ground connection of the input transducer in the main filter Fm are made opposite. Or the relation of a signal connection at one terminal/ground connection at the other terminal of the output transducer in the sub-filter Fs and relation of a signal connection at one terminal/ground connection of the output transducer in the main filter Fm are made opposite.

Figure 7:
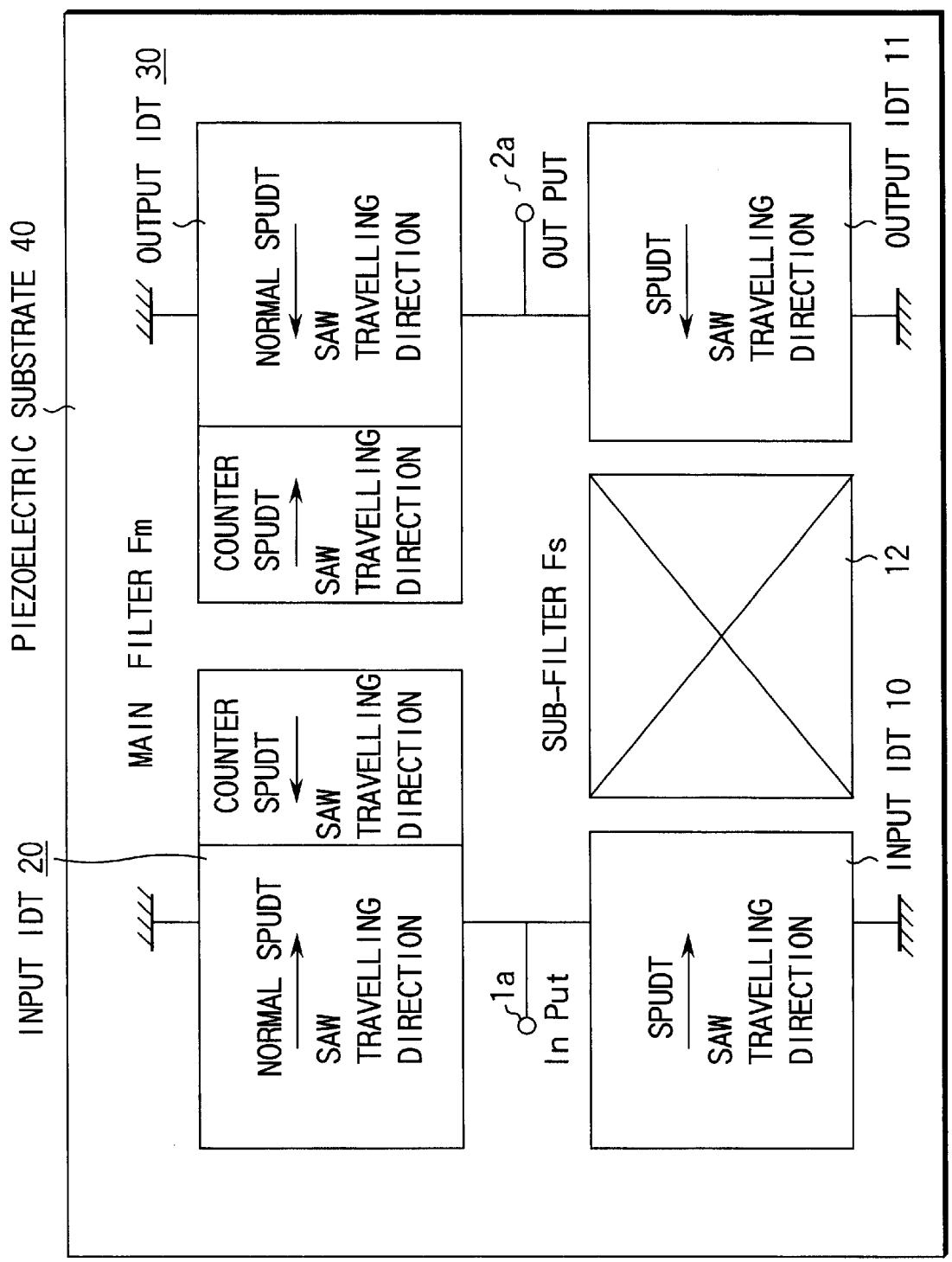
FIG. 7 is a view diagrammatically showing a structure of the surface acoustic wave device as a whole in FIG. 1.

FIG. 7 is a diagrammatic view generally showing a surface acoustic wave device of the present embodiment. The main filter and sub-filter may be of any structure including those of the present embodiment.

The input transducers 10 and 20 of the sub-filter Fs and main filter Fm are connected in common with the input terminal 1a and the output transducers 11 and 30 are connected in common with the output terminal 2a. The respective filters Fs and Fm comprise filter constituting members, that is, input and output transducers and grating reflector, formed on a common piezoelectric substrate 40. By forming these fillers Fs, Fm on the common piezoelectric substrate 40 it is possible to have a strong characteristic to a temperature variation. Further, from the standpoint of a manufacture it is also possible to manufacture the main filter Fm and sub-filter Fs in the same process. It is needless to say that the main filter and sub-filter may be formed on different chips.

Figure 8:
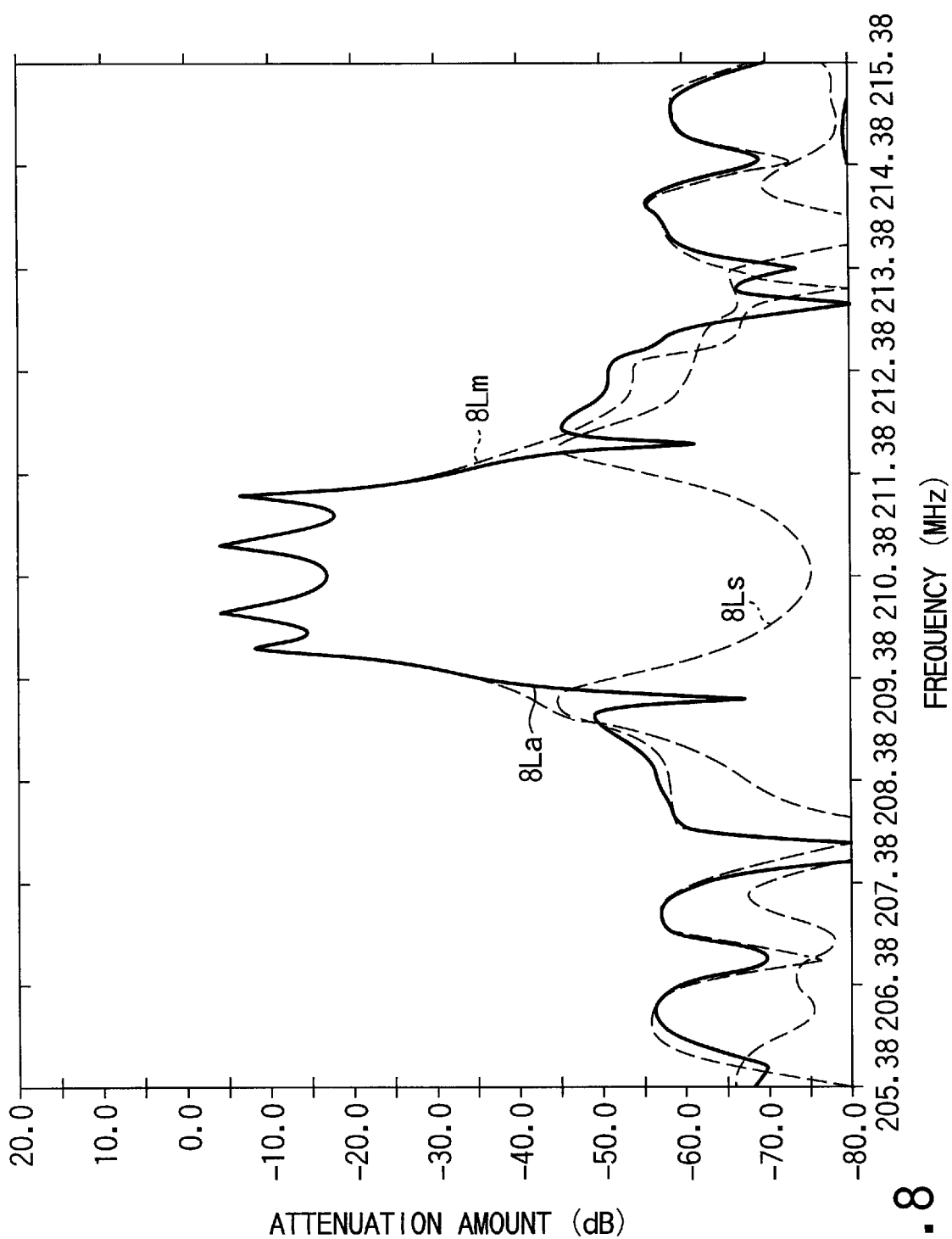
FIG. 8 is a view showing, in a not-matched state, the characteristic of the surface acoustic wave device in FIG. 7 and group delay characteristics.

FIG. 8 shows a result of simulation performed on the frequency-attenuation amount characteristic of a surface acoustic wave device as a whole combining the sub-filter Fs and main filter Fm together. It is to be noted that the solid lines 8La shows a resultant overall characteristic and that the broken lines 8Ls and 8Lm show the characteristics of the filters Fs and Fm as single elements. As evident from FIG. 8, the signals of the filters Fs and Fm reveal opposite phases near 209 MHZ and 211 MHZ and, since the signals of these filters have an opposite phase and a near amplitude level, these signals are cancelled with respect to each other and the blocking characteristic as the surface acoustic wave device becomes very abrupt. In the passband of the main filter Fm, on the other hand, the characteristic of the sub-filter Fs provides a blocking band, that is, in this area, the sub-filter is open to the main filter or the impedance is seen to be very high, so that the sub-filter imparts almost no influence to the overall characteristic. And the overall frequency passband characteristic of a device as a whole is substantially matched to the passband characteristic of the main filter Fm.

Figure 9A:
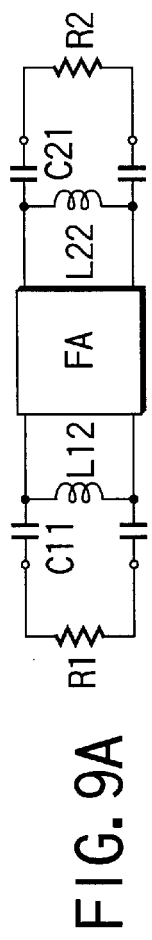
FIG. 9A shows a state in which an external matching circuit is connected to the surface acoustic wave device FA in FIG. 7.

FIG. 9A diagrammatically shows a structure of a surface acoustic wave device (indicated by FA in FIG. 9A) with an external matching circuit added thereto. The external matching circuit is comprised of elements connected to the input and output sides of the surface acoustic wave device FA. In the input side, there exist an inductor L12 connected between a signal input terminal and a ground connection terminal and a capacitor C11 connected at one side to the signal input terminal. In the output side, there exist an inductor L22 connected between a signal output terminal and a ground connection terminal and a capacitor C21 connected at one side to the signal output terminal. Although, in this example, use is made of a matching circuit comprised of L and C, it may be possible to obtain a matching by adjusting an impedance of the surface acoustic wave device as another means.

Figure 9B:
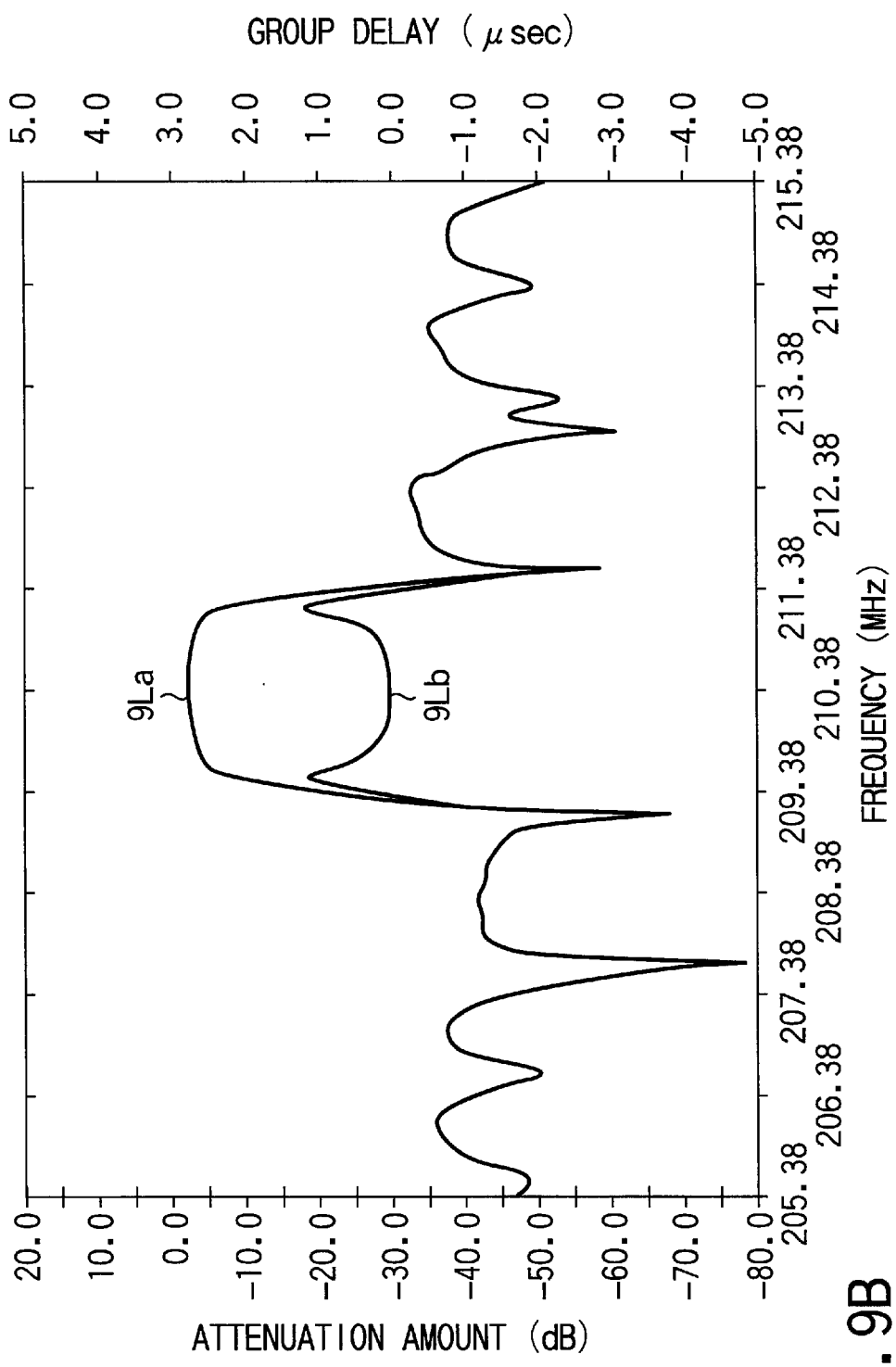
FIG. 9B is a view showing a filter characteristic, together with group delay characteristics, in a state including the surface acoustic wave device and matching circuit in FIG. 9A.

FIG. 9B shows the actual measurement of a frequency-attenuation amount characteristic 9La of the surface acoustic wave device FA with the above-mentioned matching circuit. Also shown are group delay characteristics 9Lb. With the external matching circuit thus added, a ripple existing in the passband of the characteristic shown in FIG. 8 is eliminated and the characteristic of the passband reveals a flat characteristic.

FIGS. 10A and 10B are explanatory views for explaining an effect of the surface acoustic wave device of the present invention. FIG. 10A shows a state in which a matching circuit as shown in FIG. 9A is added to the main filter Fm. And FIG. 10B shows an actual measurement of a frequency-attenuation amount characteristic 10La of the main filter Fm with the added matching circuit. Also shown are group delay characteristics.

In comparison between the characteristics of FIGS. 9B and 10B it is found that the surface acoustic wave device of the present embodiment shown in FIG. 9B reveals an abrupter blocking characteristic at its slope portion than in the case where the main filter Fm alone is used.

Ideally, it is desirable that the sub-filter Fs reveal a blocking band completely over a whole passband area of the main filter Fm but it is difficult to obtain such a characteristic with the use of a small size chip. Therefore, in order to restrict an influence of the sub-filter Fs to a minimum in a passband of the main filter Fm, it is desirable that the phase characteristic of the sub-filter Fs in the blocking band be made the same in polarity as the phase characteristic of the main filter Fm. By doing so, it is possible to suppress an abruptly varing ripple as shown in FIG. 8 in a passband of the main filter Fm.

In the surface acoustic wave device of the present embodiment, as set out in detail above, the passband characteristic of the sub-filter Fs is reflected onto an overall passband characteristic or, by adjusting the out-of-passband characteristic to make the phase characteristic of the sub-filter Fm opposite in phase to the phase characteristic of the main filter Fm, it is possible to obtain a desired characteristic. By doing so, it is possible to freely set the band characteristic and blocking characteristic of the filter as a whole by a simple method.

The above-mentioned embodiment can be changed without departing from the purport of the present invention. For example, use can be made of, as a piezoelectric substrate, a piezoelectric substrate other than the lithium borate single crystal substrate. Further, the respective filter structures are not restricted to the SPUDT structure and can be of a conventionally known type, such as a one-or a two-port type resonator filter or a transversal type filter. Although, in the above-mentioned embodiment, the filters Fm and Fs are formed on the same piezoelectric substrate, if these are formed on different substrates and different formation conditions such as the thickness of the electrode, etc., are applied to the filters Fm and Fs, then it is possible to easily obtain those characteristics required of these filters. It is also possible to apply the present invention to not only the IF (intermediate frequency) filter but also an RF (radio frequency) filter.

According to the present invention, the overall passband characteristic of the element as a whole can be determined by the passband characteristic alone of the main filter Fm while, on the other hand, the out-of-passband characteristic of the element as a whole has only to be properly adjusted with respect to the phase of the signal of the main filter Fm. And it is possible to freely set the bandwidth and blocking characteristic of the element as a whole by a simple method.

FIGS. 11A and 11B are explanatory views for explaining a basic way of thinking about the case where an internal reflection wave of the uni-directional transducer according to the present invention is analized.

FIG. 11A is a plan view showing electrode fingers 711, 712 of a portion of a first comb-like electrode 71 and a portion of electrode fingers 721, 722 of a second comb-like electrode 72. FIG. 11B shows a cross-section of the digital fingers of FIG. 11A. In FIG. 11B, 70 shows a piezoelectric substrate, 71 shows the first comb-like electrode and 711, 712 show a pair of electrode fingers, while, on the other hand, 72 shows a second comb-like electrode and 721, 722 show a pair of electrodes. Arrows A1, A2, and A3 are vectors showing the oscillation direction of a surface acoustic wave. Arrows E1, E2, E3 and E4 are the paths of waves reflected from the edges of the electrode fingers 711 and 712.

FIG. 11C show a phase relation of the vector A1 and vectors E11, E22, E33 and E44 of the respective reflected waves. This Figure sets the generation position of the vector A1 to a position G of an oscillation by a fundamental wave. Further, a distance ($\lambda/16$) from G to an edge e1, a distance ($\lambda/16$)+($\lambda/8$) to an edge e2, a distance ($\lambda/16$)+($\lambda/8$)+($\lambda/8$) to an edge e3 and a distance ($\lambda/16$)+($\lambda/8$)+($\lambda/8$)+($\lambda/8$) to an edge e4 are set.

A vector E11 of a reflected wave from the edge e1 is a phase of ($\lambda/16$)×2(both ways)=a phase of $\lambda/8$. This means that, if the phase of the vector A1 in FIG. 11 is given by 0°, $\lambda/8$ is a phase of 45°. A vector E22 from a reflected wave from the edge e2 is a phase of $-[(\lambda/16)+(\lambda/8)]\times2$(both ways)=$-3\lambda/8$. A vector E33 of a reflected wave from the edge e3 is a phase of $[(\lambda/16)+(\lambda/8)+(\lambda/8)]\times2$(both ways)= $5\lambda/8$. A vector E44 of a reflected wave from the edge e4 is a phase of $-[(\lambda/16)+(\lambda/8)+(\lambda/8)+(\lambda/8)]\times2$(both ways)=$-7\lambda/8$.

If the amplitudes of the respective reflected waves are equal by doing so, then the reflected waves are all cancelled to obtain a 0. It is possible, therefore, possible to control the phase of the reflected wave by adjusting the width and position of the electrode finger. Although, in the above-mentioned example, the interval and width of the electrode fingers are so adjusted that a resultant outcome of the vectors E11, E22, E33 and E44 except the vector A1 becomes a 0, it may be possible to adjust the vectors E11, E22, E33 and E44 so that these are situated in a first quadrant between 90° and 0° on the A1 side and in a fourth quadrant side between 0° and 270°.

In the device of the present invention, as set out above, the transducers of the main filter Fm and sub-filter Fs have first and second comb-like electrodes 71 and 72. And the first comb-like electrode 71 has a plurality of pairs of electrode fingers 711, 712 and the second comb-like electrode 72 has a plurality of pairs of electrode fingers 721, 722. Although, in the Figures, one pair of electrode fingers 711, 712 are shown on the comb-like electrode 71 and one pair of electrode fingers 721, 722 are shown on the comb-like electrode 72, more pairs of electrode fingers are provided in actual practice. The plurality of pairs of electrodes in the first and second comb-like electrodes are interleaved as a paired unit.

The reason why the electrode fingers are thus formed as pairs is because there is a flexibility with which the width of the electrode fingers and interval between the electrode fingers are adjusted. The above explanation is made on the fundamental way of thinking about obtaining the uni-directional surface acoustic wave and, stated in more detail, the following design consideration is paid to the present invention. For example, the width of the electrode finger 711 is $\lambda/16$, the interval between the electrodes 711 and 712 is $\lambda/8$, the width of the electrode finger 712 is $3\lambda/16$, the interval of the electrode fingers 712 and 721 is $\lambda/8$, and the width of the electrode finger 721 is $\lambda/16$.

The way of thinking about the surface acoustic wave device of the above-mentioned invention can be applied to an intermediate frequency filter, RF filter, etc., used on an electronic device such as a hand-held telephone set (communications device).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A surface acoustic wave device wherein
    a main filter Fm and sub-filter Fs have mutually common inputs and outputs electrically connected in parallel array,
    a frequency-attenuation amount characteristic of the sub-filter Fs has a blocking band relative to a frequency area corresponding to a passband of the main filter Fm, and
    relative to a slope portion outside the passband of the main filter Fm, the frequency-attenuation amount characteristic of the sub-filter Fs has rising areas at frequency areas on both sides of the passband of the main filter Fm, each of the rising areas constituting a passband.

2. A surface acoustic wave device according to claim 1, wherein, in the passband of the main filter Fm, there is no phase polarity variation of a signal of the sub-filter Fs.

3. A surface acoustic wave device according to claim 1, wherein the sub-filter Fs has a characteristic for allowing a passage of a signal of a phase opposite in polarity to a phase of a signal passed through the main filter Fm in a predetermined frequency area outside the passband of the main filter Fm.

4. A surface acoustic wave device according to claim 3, wherein the predetermined frequency area is included in a slope portion of the frequency-attenuation amount characteristic of the main filter Fm.

5. A surface acoustic wave device according to claim 1, wherein the main filter Fm and sub-filter Fs have their respective piezoelectric substrate and input transducer and output transducer formed on the piezoelectric substrate.

6. A surface acoustic wave device according to claim 5, wherein the input transducer and output transducer, each, have mutually opposite first and second comb-like electrodes, the first and second comb-like electrodes each have a plurality of pairs of electrode fingers, and the plurality of pairs of electrode fingers of the first and second comb-like electrodes are interleaved as a paired unit.

7. A surface acoustic wave device according to claim 5, wherein the input transducer and output transducer of the main filter Fm are comprised of a resonant type transducer combining together respective uni-directional transducers.

8. A surface acoustic wave device according to claim 5, wherein the input transducer and output transducer of the main filter Fm comprise a normal transducer section for propagating a surface wave in a predetermined one direction and counter transducer section arranged opposite to the normal transducer section and propagating a surface acoustic wave in one direction opposite to said predetermined one direction.

9. A surface acoustic wave device according to claim 5, wherein the input transducer and output transducer of the sub-filter Fs are comprised of respective uni-directional transducers.

10. A surface wave device according to claim 9, wherein a grating reflector is arranged between the input transducer and the output transducer.

11. A surface acoustic wave device according to claim 5, wherein main filter Fm and sub-filter Fs are formed on the same piezoelectric substrate.

12. A surface acoustic wave device according to claim 5, wherein the main filter Fm and sub-filter Fs are formed on corresponding different chips.

* * * * *